United States Patent [19]
Graves et al.

[11] 3,975,628
[45] Aug. 17, 1976

[54] OPTICAL HETERODYNE RECEIVER WITH PHASE OR FREQUENCY LOCK

[75] Inventors: Ross E. Graves, Pacific Palisades; Lyle S. Stokes, North Hollywood, both of Calif.

[73] Assignee: Hughes Aircraft Company, Culver City, Calif.

[22] Filed: Apr. 2, 1975

[21] Appl. No.: 564,581

[52] U.S. Cl. .................................. 250/199; 325/421
[51] Int. Cl.² .......................................... H03D 1/24
[58] Field of Search ............... 250/199; 325/421; 329/122, 123, 124

[56] References Cited
UNITED STATES PATENTS

| | | | |
|---|---|---|---|
| 3,471,803 | 10/1969 | Forster | 250/199 |
| 3,571,597 | 3/1971 | Wood | 250/199 |
| 3,573,463 | 4/1971 | Goodwin | 250/199 |
| 3,586,997 | 6/1971 | Kinsel | 250/199 |
| 3,654,473 | 4/1972 | Nussmeier | 250/199 |
| 3,695,761 | 10/1972 | Crosswy | 250/199 |

*Primary Examiner*—Benedict V. Safourek
*Assistant Examiner*—Michael A. Masinick
*Attorney, Agent, or Firm*—Don O. Dennison; William H. MacAllister, Jr.

[57] ABSTRACT

An improved optical heterodyne receiver is disclosed. Novel control circuitry is utilized in the receiver to provide compensation and tracking for undesired phase and frequency excursions of both the received and the local oscillator signals. An optical heterodyne receiver such as that disclosed is especially useful in optical communications systems having wideband variations in the frequency of the received signal caused by Doppler shifts and angle-modulated noise components.

10 Claims, 5 Drawing Figures

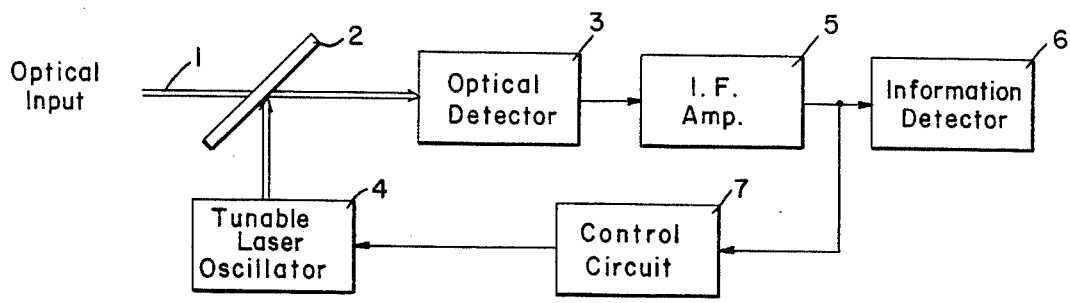
Fig. 1.
PRIOR ART
Fig. 3a.
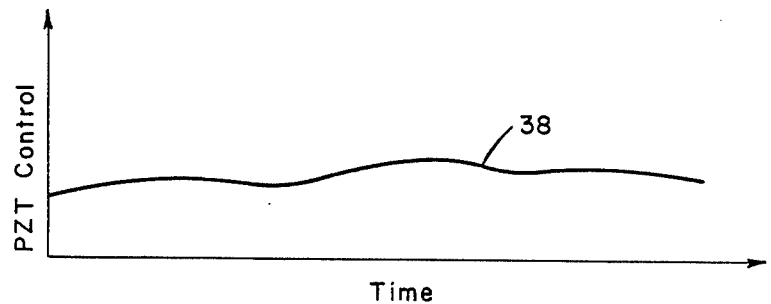
Fig. 3b.
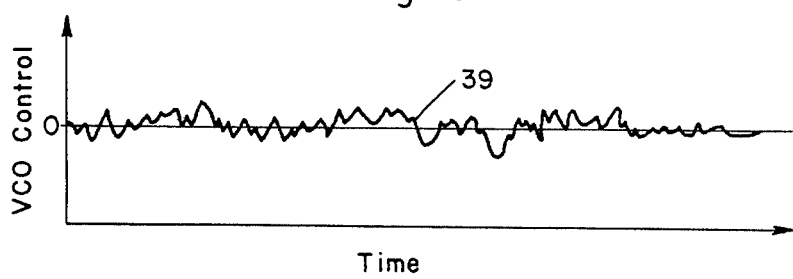

3,975,628

OPTICAL HETERODYNE RECEIVER WITH PHASE OR FREQUENCY LOCK

FIELD OF THE INVENTION

This invention relates to wideband communication receivers and more specifically to heterodyne receivers operable at wavelengths in the "optical" region.

DESCRIPTION OF THE PRIOR ART

In the past decade and one-half, many types of communications systems have been suggested which use the coherent output of laser oscillators as the information carrier. The vast spectrum made available by laser communications is well known.

Beginning with the first laser communications systems which merely used amplitude or loss modulation of a laser beam and simple quantum detection techniques, such systems have evolved with improvements being made to the modulators, detectors and directing optics of the laser beams. The generation of extremely narrow beams at the optical wavelengths of lasers, which includes not only the visible region but the infrared region as well, is highly conservative of the transmitted energy and at the same time provides a great deal of spatial security against undesired reception.

While the potential of wideband laser communication appeared virtually limitless, the availability of components necessary to realize such systems was limited. Over the intervening years, a great number of laser communication systems have been proposed, constructed and operated. Because of the many advantages enjoyed by lasers utilizing carbon dioxide as the active laser medium, they have been the focus of much recent attention. The improvements which have made such communications systems possible have included the development of highly reliable $CO_2$ lasers, the development of wideband optical modulators, the development of efficient wideband detectors and the development of suitable optical components and subsystems.

Borrowing heavily from the radio frequency art, the receivers which have been proposed for use with such laser communications systems generally utilize the so-called heterodyne principle in which the incoming optical signal is mixed with the coherent output of a laser local oscillator to produce an intermediate frequency, generally at RF. The intermediate frequency signal is then processed using relatively straightforward signal processing and detection techniques.

Communication between moving vehicles or between a fixed station and a moving vehicle may require that provision be made for Doppler shift correction. In addition, noise in the form of unwanted excursion of the frequency of the received optical signal or the receiver local oscillator signal due to causes other than the signal modulation must also be corrected. In general these corrections can be accomplished by providing in the optical receiver a laser local oscillator capable of being tuned over an extended frequency range. by phase or frequency locking the laser local oscillator to the received signal, the problems caused by frequency excursions due to noise and the Doppler shift can be eliminated.

One method of achieving wide-range frequency control is disclosed in the copending application of Ross E. Graves, Ser. No. 564,569, filed Apr. 2, 1975, entitled "Tunable Laser Oscillator" and assigned to the assignee of the present invention. That application teaches that wideband frequency response and wide-range tuning can be simultaneously achieved in a laser oscillator by combining electro-mechanical and electro-optic tuning techniques. In that application, the control signal for the laser local oscillator is split into its high frequency and low frequency components. The low frequency components are utilized to drive a piezoelectric transducer which its coupled to a mirror forming one end of the resonant laser oscillator cavity. The motion of the mirror thereby varies the physical length of the cavity and therefore the oscillator frequency. The high frequency components of the control signal are coupled to an electro-optic phase modulator disposed within the laser cavity for altering the effective electrical length and therefore the frequency of the laser oscillator. The present invention is intended to achieve similar results but without the requirement of the electro-optic phase modulator and its associated driving circuitry.

Accordingly, it is an object of the present invention to provide an optical heterodyne receiver capable of being phase or frequency-locked to the received signal over a wide range of carrier frequencies.

It is another object of the present invention to provide an optical heterodyne receiver capable of receiving input signals characterized by a wide range of rapidly varying frequency excursions.

It is a further object of the present invention to provide an optical heterodyne receiver capable of tracking phase and frequency excursions of both the received and local oscillator signals.

It is yet another object of the present invention to provide a method for simultaneously achieving wide-range tuning and wideband response in a tunable optical receiver.

SUMMARY OF THE INVENTION

In keeping with the principles of the present invention, the above objects are accomplished in a preferred embodiment by means of a dual frequency control scheme. A wide-range wideband control signal is derived from a phase detector operating at the intermediate frequency of the optical receiver. The low frequency components of the control signal are used to vary the length of the laser local oscillator cavity through a mirror mounted to an electro-mechanical transducer. The high frequency components are used to vary the output of a voltage controlled oscillator operating at i.f. and which comprises the reference input to the phase detector. The control signal output of the phase detector can also provide a demodulated replica of phase or frequency modulation appearing on the optical input signal.

A portion of the output of the voltage controlled oscillator is also coupled to a second phase detector together with the output of the receiver i.f. stage. The second phase detector comprises a synchronous detector thereby providing the receiver output for amplitude modulated optical input signals.

In a second embodiment of the present invention, the first phase detector and phase-locked loop are replaced by a frequency discriminator and a frequency-locked loop. The frequency-locked loop, in turn, includes a mixer and a second i.f. stage. The synchronous detector is also replaced with a conventional envelope detector at the output of the second i.f.

BRIEF DESCRIPTION OF THE DRAWINGS

In order that the invention may be clearly understood and readily carried into effect, it will now be described with reference by way of example to the accompanying drawings, wherein like reference numerals refer to like elements and in which:

FIG. 1 is a block diagram of a laser heterodyne receiver of prior art construction included to facilitate an understanding of the present invention;

FIGS. 3A and 3B are graphical representations of the low-frequency and high-frequency components of the control signal of the embodiment of FIG. 2.

DESCRIPTION OF THE PREFERRED EMBODIMENT

Figure 2:
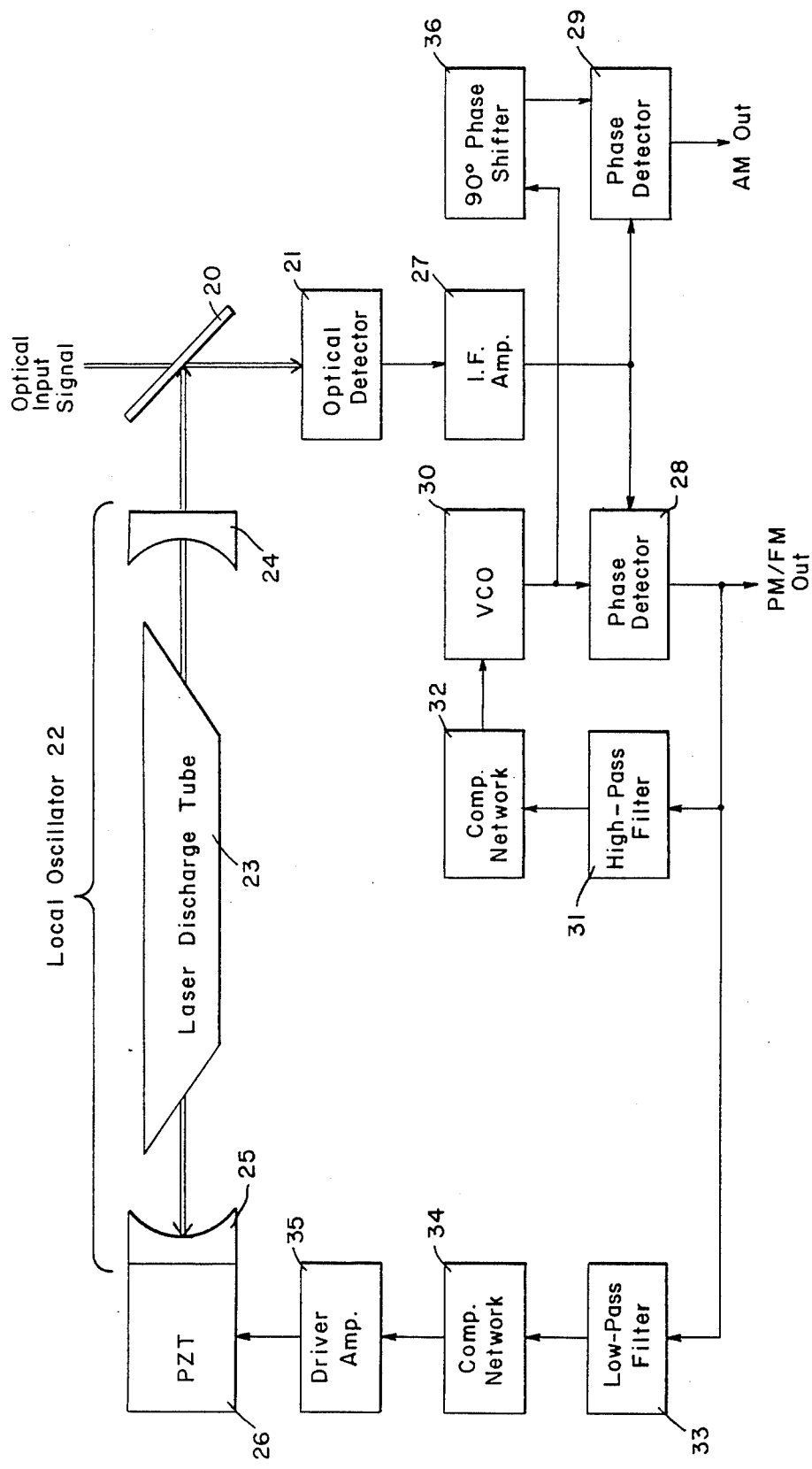
FIG. 2 is a block diagram of a preferred embodiment of the present invention.

Referring more specifically to the drawings, there is shown in FIG. 1 a simplified block diagram of an optical heterodyne receiver in accordance with the prior art. FIG. 1 is included in order to facilitate an understanding of the present invention. In FIG. 1, an optical input signal in the form of a beam 1 is passed through a beam combiner 2 to an optical detector 3. The output from a tunable laser oscillator 4 is also directed to beam combiner 2 and thence to optical detector 3. Beam combiner 2 which can comprise a beam-splitting mirror or other suitable device spatially combines the input signal with the signal from the tunable laser local oscillator. If the two beams are spatially well aligned, optical interference will take place on the photodetector surface of optical detector 3. The difference or intermediate frequency resulting from the mixing of the two signals is extracted from optical detector 3 and passed through i.f. amplifier 5 to an information detector 6. A portion of the output of i.f. amplifier 5 is extracted through a control circuit 7 provides a signal for controlling the frequency of tunable laser local oscillator 4.

It is apparent from the above description that optical detector 3 functions as a mixer in the context of the circuit of FIG. 1 and the present invention. Although the terms "photo mixer" or "optical mixer" are also employed in describing this element, the term "optical detector" is retained herein in keeping with more common practice.

If the frequency of the input optical wave energy changes, for example due to the Doppler shift, a control signal will be developed which changes the frequency of the laser local oscillator so that the difference frequency between the local oscillator and the input signal is maintained substantially constant at the desired intermediate frequency. Information detector 6 can comprise a conventional envelope detector or other suitable demodulating means appropriate to the type of modulation utilized.

An arrangement such as that shown in FIG. 1 is disclosed in U.S. Pat. No. 3,482,099 which issued to F. E. Goodwin on Dec. 2, 1969. According to the teachings of this patent, tunable laser oscillator 4 comprises a Zeeman tuned stable laser. Frequency control is obtained by varying both the physical length of the laser cavity and a magnetic field applied to the active laser medium.

In applications requiring more precise frequency tracking and a faster response to rapid excursions in the frequency of both the received signal and the local oscillator signal, phase-locked receiver operation is desirable. Phase-locked operation is also desirable if synchronous demodulation of the received signal is to be employed. In FIG. 2 there is shown in block diagram a phase-locked heterodyne receiver in accordance with the present invention.

In FIG. 2 an optical input signal which has been suitably filtered and collimated by means of receiving optics, not shown, is passed through a beam combiner 20 to optical detector 21. The output beam from laser local oscillator 22 is also directed to beam combiner 20 and then to optical detector 21 in the manner known in the art.

Laser local oscillator 22 comprises a laser discharge tube 23 containing an active laser medium such as carbon dioxide and a pair of axially aligned reflecting end members or mirrors 24 and 25. Mirror 25 is suitably bonded to one side of a piezoelectric transducer 26. As such, mirror 25 is free to move in the axial direction in response to a control signal applied to piezoelectric transducer 26 to thereby vary the length of the optical cavity.

The output of optical detector 21 is coupled to the input of an intermediate frequency amplifier 27 the output of which is coupled respectively to first inputs of phase detector 28 and phase detector 29. Phase detector 28, which comprises the loop phase detector for frequency and phase tracking, has its second input coupled to the output of a voltage controlled oscillator 30. The output of phase detector 28 which comprises the control output of the receiver phase-locked loop is coupled first through a highpass filter 31 and a compensation network 32 to the control input of voltage controlled oscillator 30. A second portion of the output of phase detector 28 is coupled through a lowpass filter 33, a second compensation network 34, and a driver amplifier 35 to the input of piezoelectric transducer 26.

Synchronous detection of the amplitude modulated components of the optical input signals is obtained from the second phase detector 29. As mentioned, one of the inputs to phase detector 29 is derived from the output of i.f. amplifier 27. The other input to phase detector 29 is obtained from voltage controlled oscillator 30 through a 90° phase shift network 36. If desired, a second output port can be provided at the output of phase detector 28. The signal at this point, as mentioned previously, represents the wideband control signal for phase and frequency tracking. As such, those components of the optical input signal which are phase or frequency modulated are also present at this output.

Because of the many advantages enjoyed by carbon dioxide ($CO_2$) lasers in modern optical communications systems, the invention advantageously utilizes such a laser in local oscillator 22. It is understood, however, that this is merely exemplary and that other lasers using other active laser media may be employed with suitable changes in the associated components. It is also understood that laser discharge tube 23 is provided with suitable pumping means, not shown, for creating a population inversion within the energy level system of the $CO_2$ to sustain laser action.

In operation, an optical input signal from a remote transmitter is coupled to the receiver after first having been filtered and collimated by appropriate receiving optics, not shown. The collimated input signal is directed through beam combiner 20 to a surface of optical detector 21. The local oscillator beam from local oscillator 22 is also directed to the surface of optical detector 21 by means of beam combiner 20. By spatially aligning these two beams, optical interference takes place on the photodetector surface of optical detector 21 thereby producing an output signal corresponding to their difference frequency. The difference or intermediate frequency is amplified by i.f. amplifier 27 and coupled to one input of phase detector 28. The other input of phase detector 28 which is derived from voltage controlled oscillator 30 operating on a nominal frequency equal to the intermediate frequency is compared with this i.f. output signal in phase detector 28.

It is expected that in any practical communication system, frequency excursions on the input signal or on the local oscillator signal will be present. The phase differences between the signals input to phase detector 28 are coupled out of phase detector 28 as a control signal. The low frequency components of this control signal are coupled through lowpass filter 33, compensation network 34, and applied to the input of driver amplifier 35 which drives piezoelectric transducer 26. The high frequency components of the control signal, on the other hand, are coupled through highpass filter 31 and a second compensation network 32 to the control input of voltage controlled oscillator 30.

A typical waveform of the PZT drive voltage is shown by curve 38 in FIG. 3A. In general, the low frequency component of the control voltage is caused by the rather slowly varying shift in input signal frequency caused by the Doppler effect and by frequency drifts in the transmitter and local oscillator lasers. Although the total frequency excursion of the input signal at optical wavelengths may be on the order of plus or minus several hundred megahertz, the large frequency excursions appear rather gradually. With the drive voltage of curve 38 applied to PZT 26, mirror 25 moves about its resting position thereby shortening and lengthening the length of the laser cavity. As is well known, the frequency change produced by a change in the cavity length $\Delta L$ is given by the expresssion $\Delta f = -(\Delta L) c/\lambda L$, where $c$ is the propagation velocity, $L$ is the cavity length, and $\lambda$ is the wavelength.

The high frequency variations in the control voltage are depicted by curve 39 of FIG. 3B. In general, these rapidly occurring frequency variations are caused by many factors including, but not limited to, phase and frequency modulation produced by vibration and microphonics in both the transmitted and local oscillator signals and by rapid changes in the Doppler shift. Curve 39 represents the control input to voltage controlled oscillator 30. Due to the so-called "acoustic resonance" of the piezoelectric transducer/mirror assembly, these rapid variations cannot be compensated for by the PZT/mirror alone. These rapid frequency variations, however, are "wiped off" by the action of the i.f. tracking loop comprising phase detector 28, high-pass filter 31, compensation network 32, and voltage controlled oscillator 30.

Compensation networks 32 and 34 are included in order to achieve the desired cross-over action of the electromechanical and i.f. portions of the phase tracking circuitry. In general, it is desirable that the overall transfer function of the serially connected chain of components comprising lowpass filter 33, compensation network 34, driver amplifier 35, and piezoelectric transducer 26 drop off to a value which is very small somewhat below the so-called "acoustic resonance" of PZT 26. In a typical embodiment this might correspond to a frequency on the order of 4 kilohertz. The transfer function of the i.f. tracking loop is therefore chosen so that it predominates at frequencies above the cross-over frequency.

Synchronous detection of the amplitude modulated information components of the input signal is obtained through the use of phase detector 29. The output of i.f. amplifier 27 is coupled to one input of phase detector 29 and compared with the output of voltage controlled oscillator 30 which has been passed through 90° phase shifter to assure that the reference signal to phase detector 29 is in phase with (or antiphase with) the carrier of the AM signal.

Figure 4:
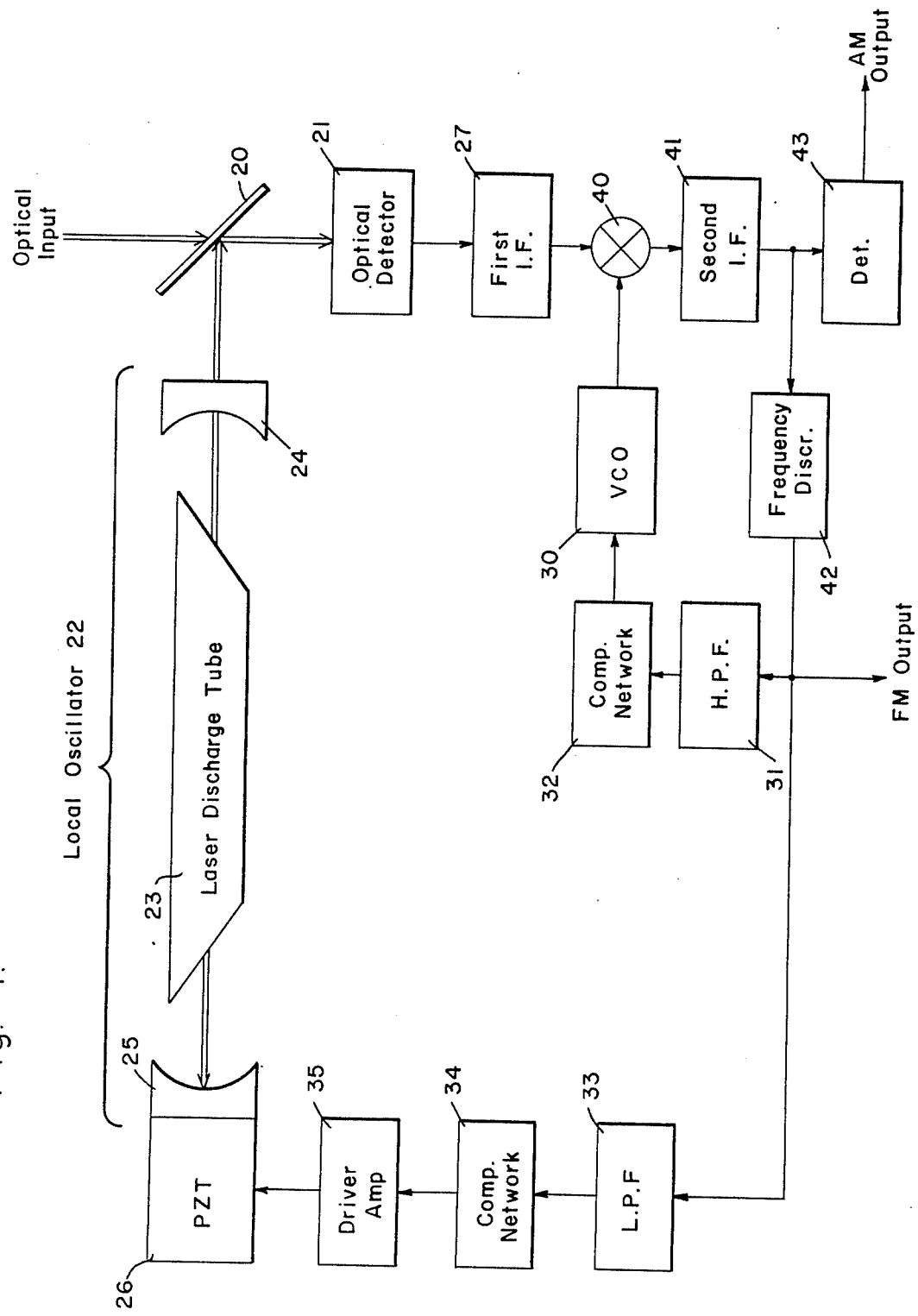
FIG. 4 is a block diagram of a second embodiment of the present invention using frequency-lock techniques.

With suitable modifications, the principles of the present invention can also be extended to a frequency-locked optical heterodyne receiver. Such a receiver is depicted in the block diagram of FIG. 4. The receiver of FIG. 4 corresponds to a dual conversion heterodyne receiver. In FIG. 4, a second mixer 40 is provided at the output of i.f. amplifier 27. The output of mixer 40 is coupled to a second i.f. amplifier stage 41 and its output, in turn, is coupled to a frequency discriminator 42. Frequency discriminator 42 replaces the phase detector utilized in the embodiment of FIG. 2. A conventional envelope detector 43 is also coupled to the output of the second i.f. amplifier 41 to provide the detected amplitude modulated output from the receiver.

The operation of the embodiment of FIG. 4 is similar to that of FIG. 2 in that the frequency controlled signal derived from frequency discriminator 42 is split into its low frequency and high frequency components for frequency tracking. Low frequency correction is again obtained electromechanically through the agency of mirror 25 and piezoelectric transducer 26.

High frequency tracking is obtained through the tracking loop which consists of highpass filter 31, compensation network 32, voltage controlled oscillator 30, mixer 40, second i.f. amplifier 41 and frequency discriminator 42. Since only frequency tracking and not phase tracking is available with the receiver of FIG. 4, the auxiliary output contains only the frequency modulated information containing components of the optical input signal.

In all cases it is understood that the abovedescribed embodiments are merely illustrative of but two of the many possible specific embodiments which can represent applications of the principles of the present invention. Numerous and varied other arrangements can be readily devised in accordance with these principles by those skilled in the art without departing from the spirit and scope of the invention.

What is claim is:

1. An optical heterodyne receiver comprising, in combination:
   a tunable laser oscillator, said laser oscillator having an output and a control input;
   means for combining said laser oscillator output with a received optical input signal;
   an optical detector coupled to said combining means, said optical detector being adapted to provide an intermediate frequency signal representative of the difference between said laser oscillator output and said received input signal;
   a controllable r.f. oscillator having a reference signal output and a control input;

comparison means for generating a wideband control signal representative of the difference between said intermediate frequency signal and said reference signal;

first means for coupling a first component of said control signal to said control input of said laser oscillator;

second means for coupling a second component of said control signal to said control input of said controllable r.f. oscillator; and r.f. detector means coupled to said comparison means for deriving an output signal from said receiver.

2. The receiver according to claim 1 wherein said combining means comprise a beam splitting mirror.

3. The receiver according to claim 1 wherein said first means includes a lowpass filter.

4. The receiver according to claim 1 wherein said second means includes a highpass filter.

5. The receiver according to claim 1 wherein said comparison means comprises a first phase detector.

6. The receiver according to claim 5 wherein said r.f. detector comprises a second phase detector having a pair of inputs, one of said inputs being coupled to the input of said first phase detector and the other of said inputs being coupled through a phase shifter to the signal output of said controllable oscillator.

7. The receiver according to claim 1 wherein said comparison means comprises the serial combination of a mixer, an i.f. stage and a frequency discriminator.

8. The receiver according to claim 7 wherein said r.f. detector comprises an envelope detector.

9. The method of phase locking an optical heterodyne receiver to an optical input signal comprising the ordered steps of:

generating an optical local oscillator signal;

combining said local oscillator signal with said input signal;

optically mixing the combined signals to produce an intermediate frequency signal;

generating a reference signal having a nominal frequency substantially equal to said intermediate frequency;

comparing said reference and intermediate frequency signals to produce a control signal representative of phase differences between the compared signals;

controlling the frequency of said local oscillator signal substantially in response to a first portion of said control signal; and controlling the frequency of said reference signal substantially in response to a second portion of said control signal.

10. The method of frequency locking an optical heterodyne receiver to an optical input signal comprising the ordered steps of:

generating an optical local oscillator signal;

combining said local oscillator signal with said input signal;

optically mixing the combined signals to produce a first intermediate frequency signal;

generating a reference signal;

mixing said first intermediate frequency signal and said reference signal to produce a second intermediate frequency signal;

frequency discriminating said second intermediate frequency signal to produce a control signal;

controlling the frequency of said local oscillator signal substantially in response to a first portion of said control signal; and controlling the frequency of said reference signal substantially in response to a second portion of said control signal.

* * * * *